(12) United States Patent
Chen (10) Patent No.: US 11,823,729 B2
(45) Date of Patent: Nov. 21, 2023

(54) COMMAND CLOCK GATE IMPLEMENTATION WITH CHIP SELECT SIGNAL TRAINING INDICATION

(71) Applicant: Micron Technology, Inc., Boise, ID (US)

(72) Inventor: Liang Chen, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 17/491,422

(22) Filed: Sep. 30, 2021

(65) Prior Publication Data
US 2023/0108373 A1 Apr. 6, 2023

(51) Int. Cl.
| | |
|---|---|
| *G11C 7/22* | (2006.01) |
| *G11C 11/4076* | (2006.01) |
| *G11C 29/02* | (2006.01) |
| *G06F 13/28* | (2006.01) |
| *G11C 29/56* | (2006.01) |
| *G11C 7/10* | (2006.01) |

(52) U.S. Cl.
CPC .......... *G11C 11/4076* (2013.01); *G06F 13/28* (2013.01); *G11C 29/023* (2013.01); *G11C 29/56012* (2013.01); *G11C 7/1039* (2013.01); *G11C 7/222* (2013.01)

(58) Field of Classification Search
CPC ............. G11C 11/4076; G11C 29/023; G11C 29/56012; G11C 7/1039; G11C 7/222; G06F 13/28
See application file for complete search history.

(56) References Cited

U.S. PATENT DOCUMENTS

| | | | |
|---|---|---|---|
| 10,176,862 B1* | 1/2019 | Penney | G06F 11/1004 |
| 10,452,319 B1* | 10/2019 | Penney | G11C 11/4076 |
| 11,211,103 B1* | 12/2021 | Mazumder | G11C 7/1018 |
| 2019/0066758 A1* | 2/2019 | Gajapathy | G11C 7/109 |
| 2019/0164583 A1* | 5/2019 | Penney | G11C 11/4076 |
| 2019/0244645 A1* | 8/2019 | Penney | G11C 7/1051 |
| 2021/0304809 A1* | 9/2021 | Waldrop | G11C 11/4093 |

* cited by examiner

*Primary Examiner* — Mushfique Siddique
(74) *Attorney, Agent, or Firm* — Fletcher Yoder, P.C.

(57) ABSTRACT

Systems and methods for gating, via clock gating circuitry, a clock signal based at least in part on a mode register value indicative of synchronization of a command address signal with the clock signal when the mode register value indicates synchronization of the command address signal with the clock signal has not occurred. The clock gating circuitry is configured to, gate the clock signal based at least in part on the mode register value and a chip select signal value when the mode register value indicates synchronization of the command address signal with the clock signal has occurred.

20 Claims, 5 Drawing Sheets

COMMAND CLOCK GATE IMPLEMENTATION WITH CHIP SELECT SIGNAL TRAINING INDICATION

BACKGROUND

Field of the Present Disclosure

Embodiments of the present disclosure relate generally to the field of semiconductor devices, and more specifically, to using a register to indicate chip select clock and/or command address buffer training in memory devices for command clock gating purposes.

Description of Related Art

Semiconductor devices (e.g., memory devices) may employ command clock gating to enable or disable an internal clock of a memory device based upon the validity of a command. The memory device may detect that a valid command is transmitted to and/or indicated in a command address buffer when a chip select signal is detected as a logical low. However, due to topology of the memory device, the chip select clock signal may be unknown until a relationship between an internal clock signal and the chip select signal is established.

Embodiments of the present disclosure may be directed to address one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices may employ command clock gating to enable or disable an internal clock of a memory device based upon the validity of a command. The command clock gating may use a chip select signal to gate the internal clock of the memory device. That is, the internal clock of the memory device may be switched off until a valid command is detected. However, the topology of a memory device may prevent foreknowledge of a timing specification for the chip select signal. That is, the topology of the memory device may cause the internal clock signal to arrive from a host device and start toggling in the memory device unsynchronized with the chip select signal before the chip select signal arrives at clock gating circuitry.

Accordingly, until the relationship (e.g., synchronization) between an internal clock signal and the chip select clock signal is established, the chip select signals may not be used to gate the internal clock signal and the internal clock may run at full speed to ensure complete capture of one or more valid commands in the command address buffer. Once the relationship is established, the chip select signal is considered trained (e.g., synchronized with the internal clock signal) and the internal clock may be correctly gated with the chip select signal.

Furthermore, the command address buffer may undergo training to synchronize a command address signal with the internal clock signal because of the topology of the memory device described above. However, there is currently no indication that the chip select clock and/or the command address signal are trained. As such, improved systems for indicating a training state of the chip select clock and/or the command address signal are desired.

Figure 1:
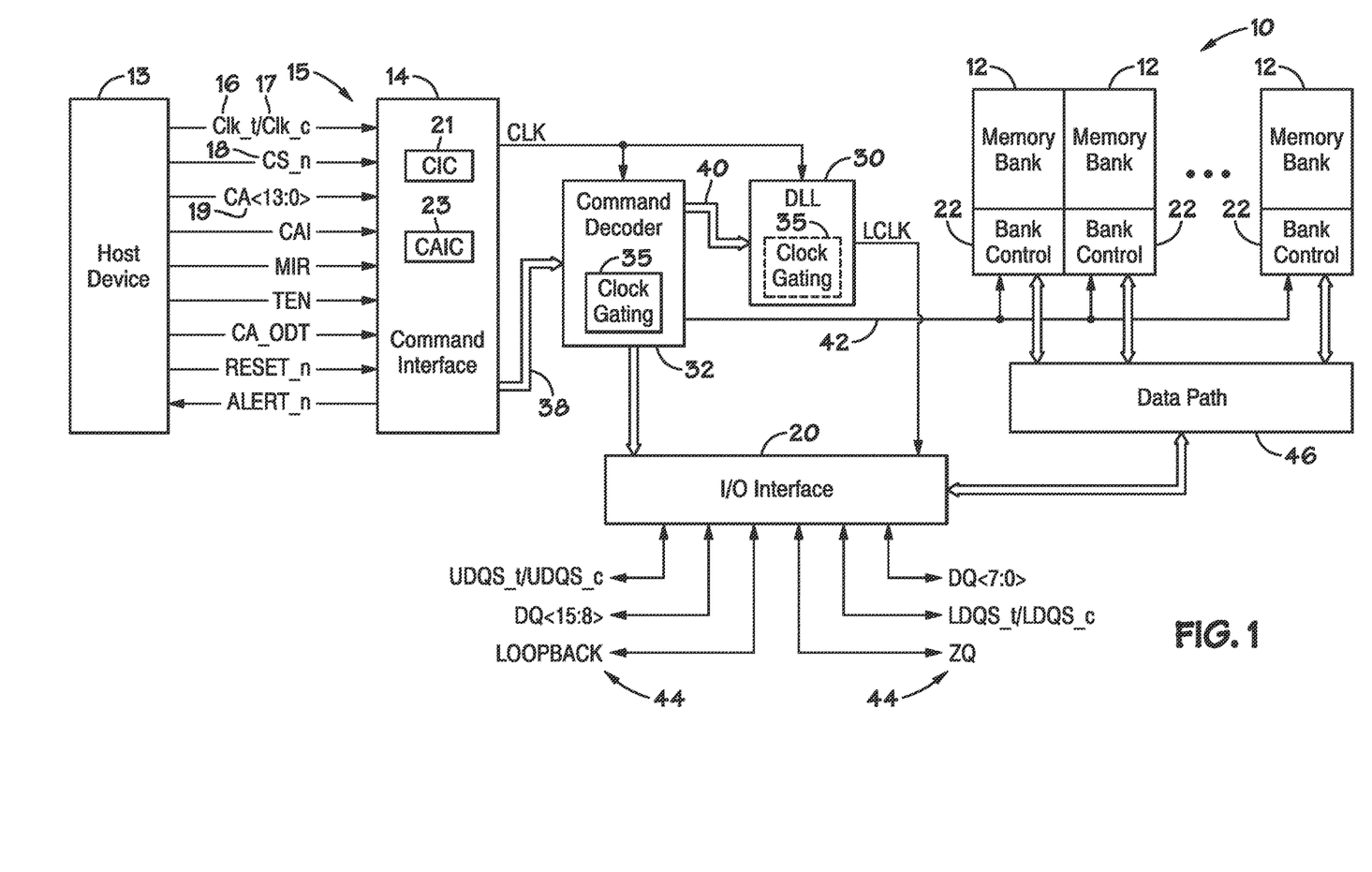
FIG. 1 is a simplified block diagram illustrating some features of a memory device, according to an embodiment of the disclosure.

With the foregoing in mind, FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device 10, such as decoding, timing control, data control, and any combination thereof.

A command interface 14 of the memory device 10 is configured to receive and transmit a number of signals (e.g., signals 15). The signals 15 may be received from an host device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 21 and a command address input circuit 23, for instance, to ensure proper handling of the signals 15. The command interface 14 may receive one or more clock signals from an external device. Generally, double data rate (DDR) memory utilizes a differential pair of system clock signals, referred to herein as the true clock signal 16 (Clk_t) and the bar clock signal 17 (Clk_c). A positive clock edge for DDR refers to the point where a rising true clock signal Clk_t 16 crosses a falling bar clock signal Clk_c 17. A negative clock edge indicates a transition of a falling true clock signal Clk_t 16 and a rising of the bar clock signal Clk_c 17. Commands (e.g., read command, write command, etc.) are typically entered on the positive edges of the clock signal. Data may be transmitted or received on both the positive and the negative clock edges.

The clock input circuit 21 receives the true clock signal (Clk_t 16) and the bar clock signal (Clk_c 17) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to an I/O interface 20, for instance, and is used as a timing signal for determining an output timing of read data. In some embodiments, as discussed below, the clock input circuit 21 may include circuitry that splits the clock signal into multiple (e.g., four) phases. The clock input circuit 21 may also include phase detection circuitry to detect which phase receives a first pulse when sets of pulses occur too frequently to enable the clock input circuit 21 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 38 and may decode the command signals to provide various internal commands. For instance, the command decoder 32 may provide command signals to the DLL circuit 30 over the bus 40 to coordinate generation of the phase controlled internal clock signal LCLK. The phase controlled internal clock signal LCLK may be used to clock data through the I/O interface 20, for instance.

Further, the command decoder 32 may decode incoming commands, such as read commands, write commands, mode-register set commands, activate commands, etc., and provide access to a particular memory bank 12 corresponding to the command via the bus path 42. As will be appreciated, the memory device 10 may include various other decoders, such as row decoders and column decoders, to facilitate access to the memory banks 12.

The command decoder 32 may include clock gating circuitry 35. In some embodiments, the clock gating circuitry 35 may be included in other locations within the memory device 10 (e.g., the DLL circuit 30). The clock gating circuitry 35 may employ command clock gating to enable or disable the internal clock based upon the validity of a command.

The memory device 10 executes operations, such as read commands and write commands, based on the command/address signals received from an external device, such as a processor. In one embodiment, the command/address bus 38 may be a 14-bit bus to accommodate the command/address signals 19 (CA). The command/address signals are clocked to the command interface 14 using the clock signals (Clk_t 16 and Clk_c 17). The command interface 14 may include a command address input circuit 23 which is configured to receive and transmit the commands to provide access to the memory banks 12 through the command decoder 32. In addition, the command interface 14 may receive a chip select signal 18 (CS_n). The CS_n signal 18 may also be viewed as an incoming clock signal. The CS_n signal 18 enables the memory device 10 to process commands on the incoming CA signals 19 bus. Access to specific memory banks 12 within the memory device 10 is encoded on the CA signals 19 bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of the CA signals 19 on the command/address bus 38, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 44 through the I/O interface 20. More specifically, the data may be sent to or retrieved from the memory banks 12 over a datapath 46, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t 16 and Clk_c 17), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 20. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 20. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 20.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description.

As discussed above, the CS_n signal 18 enables the memory device 10 to process commands on the incoming CA signals 19 bus. Before the CS_n signal 18 is trained (e.g., synchronized with the internal clock signal), the CS_n signal 18 is unpredictable and the timing specification of the CS_n signal 18 is unknown. Additionally, the CA signals 19 may not be initially trained to be synchronized with the internal clock signal.

Figure 2:
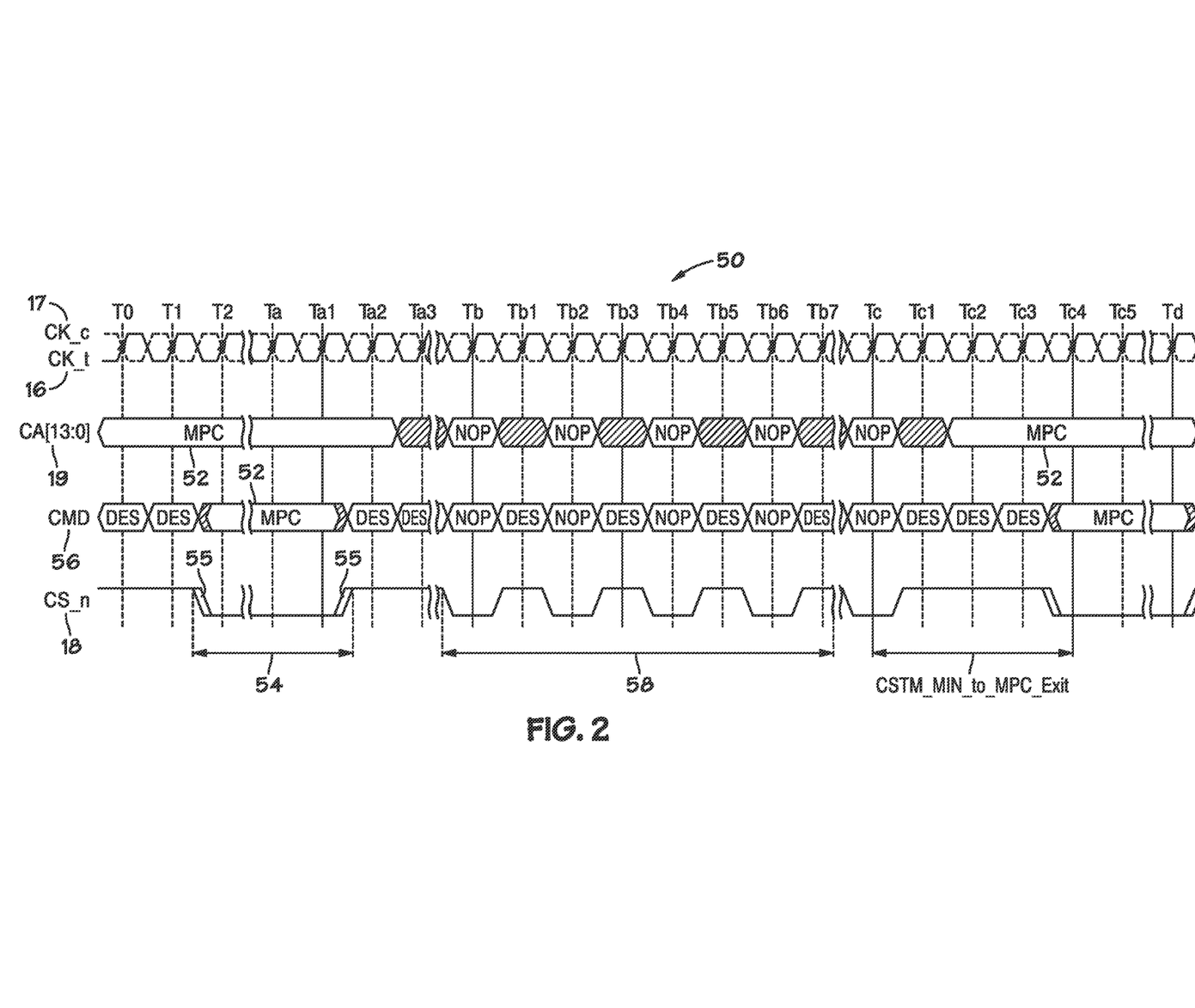
FIG. 2 is a timing diagram illustrating training of a chip select signal, according to an embodiment of the disclosure.

With the foregoing in mind, FIG. 2 is a timing diagram 50 of an embodiment of training of the CS_n signal 18. The CA signals 19 bus may transmit a multi-purpose command (MPC) 52. The MPC 52 may include a decode command, which indicates to the memory device to begin training of the CS_n signal 18. The MPC 52 may be supplied by a host device. The host device may be any system or device which communicates with the memory device 10.

However, the CS_n signal 18 may be de-asserted to ensure that the memory device 10 receives the MPC 52, as illustrated by pulse 54. One or more regions 55 located on both sides of the CS_n signal 18 represent the unpredictability of the CS_n signal 18. The CS_n signal 18 during pulse 54 is unknown to the memory device 10 and the pulse 54 is merely a representation illustrating that the CS_n signal 18 is de-asserted at any particular point during the relevant clock cycles of the Clk_t 16 signal.

Since the timing specification of the CS_n signal 18 may be unknown before the training of the CS_n signal 18, the CS_n signal 18 is de-asserted (e.g., brought at a logical low) for a specific number of cycles to ensure that the MPC 52 from the CA signal 19 bus is captured. Furthermore, once the CS_n signal 18 is asserted (e.g., brought to a logical high) following the pulse 54, the CA signal 19 may continue to be asserted due to the unknown relationship between the CS_n signal 18 and the Clk_t 16 signal to ensure capture of a command supplied by the CA signal 19 bus.

A CMD signal 56 may indicate a current command at and/or in the memory device 10 that has been decoded from a current or previous CA signal 19. That is, the CMD signal 56 may indicate when the memory device 10 has begun to execute any given command supplied by the CA signal 19 bus. The CMD signal 56 may execute a "Deselect" command (DES) when the CS_n signal 18 is asserted. As discussed above, the CS_n signal 18 may be de-asserted for two or more cycles to validate that the CS_n signal 18 is correctly de-asserted. Following the two or more cycles for validation, the CS_n signal 18 may be used to center the CMD signal 56 to decode the MPC 52 from the CA signal 19 bus.

To train the CS_n signal 18, the host device, such as a processor or controller, may provide a toggling signal for the CS_n signal 18 continuously, as illustrated by one or more pulses 58. The host device may detect the high leveling and the low leveling for the CS_n signal 18 after a point in time during toggling of the CS_n signal 18 and shift the CS_n signal 18 relative to the Clk_t signal 16. The host device may set a mode register to indicate when the CS_n signal 18 is trained. In some embodiments, the host device may use any unused mode register available in the memory device 10. That is, the host device may set the mode register to be asserted when the CS_n signal 18 is trained and otherwise set the mode register be de-asserted. In some embodiments, asserting a value may indicate that the value is a logical high and de-asserting the value may indicate that the value is a logical low. In other embodiments, inverted logic may be implemented and, asserting a value may indicate that the value is a logical low. Moreover, the logic circuits described herein may be modified to reflect a state of logic (e.g., an inverted state or a non-inverted state of logic). In some embodiments, the host device may train the CA signal 19 before setting the mode register to indicate the training of the CS_n signal 18. Thus, the host device may set the mode register to indicate that the CS_n signal 18 and the CA signal 19 are trained. The training of the CS_n signal 18 may exit following capture of the MPC 52 to exit the CS_n signal 18 training.

Figure 3:
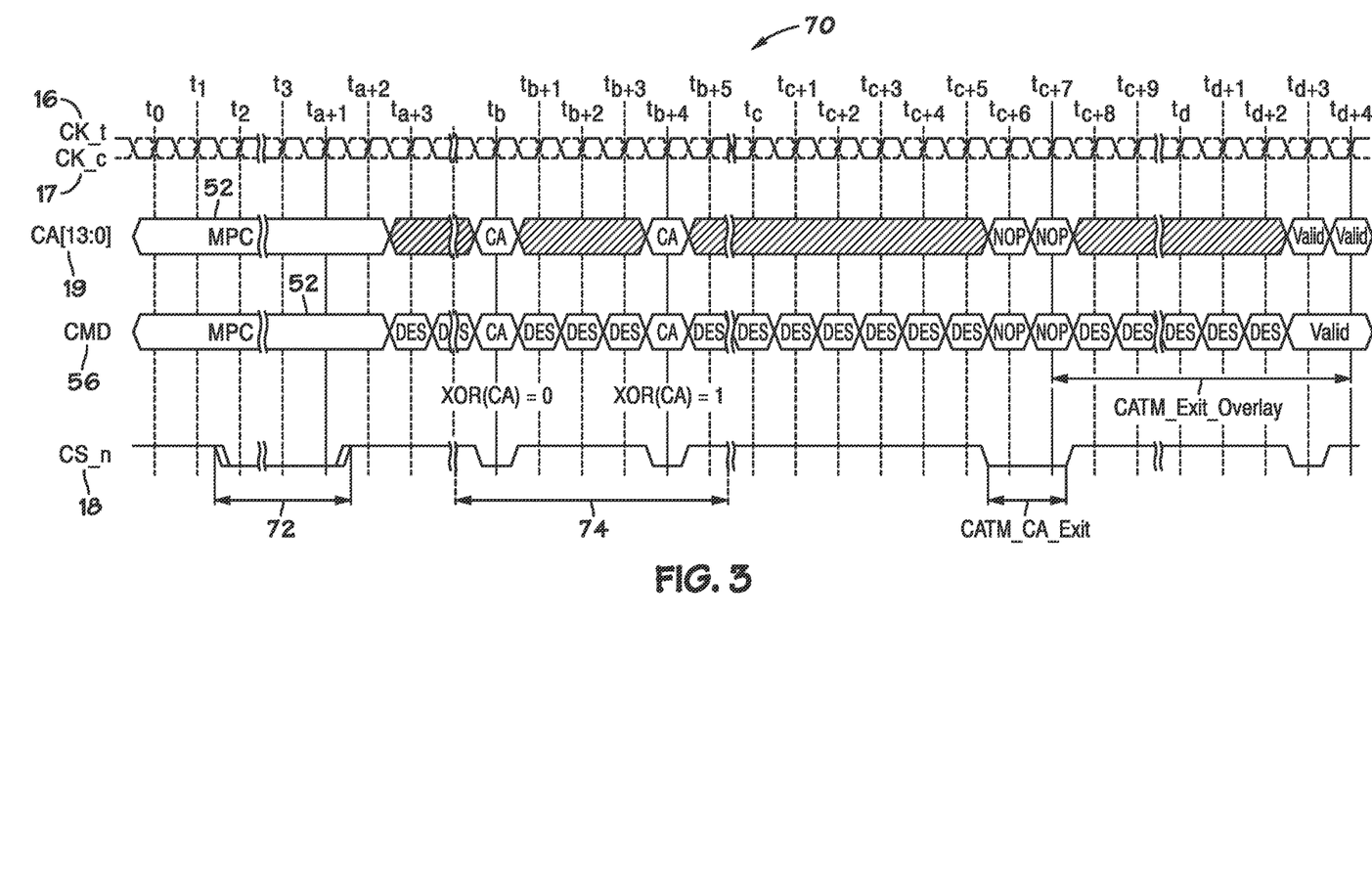
FIG. 3 is a timing diagram illustrating training of a command address signal, according to an embodiment of the disclosure.

With the foregoing in mind, FIG. 3 is a timing diagram 70 of an embodiment of training the CA signal 19. As discussed above, the CA signal 19 may be trained and synchronized with the Clk_t signal 16. The CA signal 19 bus may carry the MPC 52 to indicate to the memory device 10 to begin training the CA signal 19. Similar to FIG. 2, the CS_n signal 18 signal may be de-asserted to ensure that the memory device 10 receives the MPC 52 for the CA signal 19 training, as illustrated by a pulse 72. In some embodiments, the pulse 72 may be during the same time frame as the pulse 54. In some embodiments, the CA signal 19 training may be performed separately at a different point in time than the CS_n signal 18 training. In other embodiments, the CA signal 19 training may occur following or concurrently with the training of the CS_n signal 18.

During the CA signal 19 training, one or more iterations of the MPC 52 on the CA signal 19 bus may be transmitted to the memory device 10. The memory device 10 may capture one or more sample values of the CA signal 19 from the CA signal 19 bus, as illustrated by one or more pulses 74. The memory device 10 may capture each sample value at a rising edge of the Clk_t 16 signal. In some embodiments, the memory device 10 may capture the one or more sample values while the CS_n signal 18 is asserted. The memory device 10 may perform one or more logic operations on the one or more sample values. By way of example, the memory device 10 may perform a XOR operation on each of the sample values to determine an output value. The memory device may transmit the output value as DQ values based on whether the sampled values match expected values. The host device may be expecting a particular output value as DQ values from the memory device 10. Once the XOR operation on one or more sample value of the CA signal 19 is recorded, the CS_n signal 18 is completed, and the host device may record the relationship between the CA signal 19 and the internal clock. The host device may set the mode register(s) to an asserted value to indicate training of the CS_n signal 18 and/or the CA signal 19 based upon the output value received as the DQ values from the memory device 10.

Figure 4:
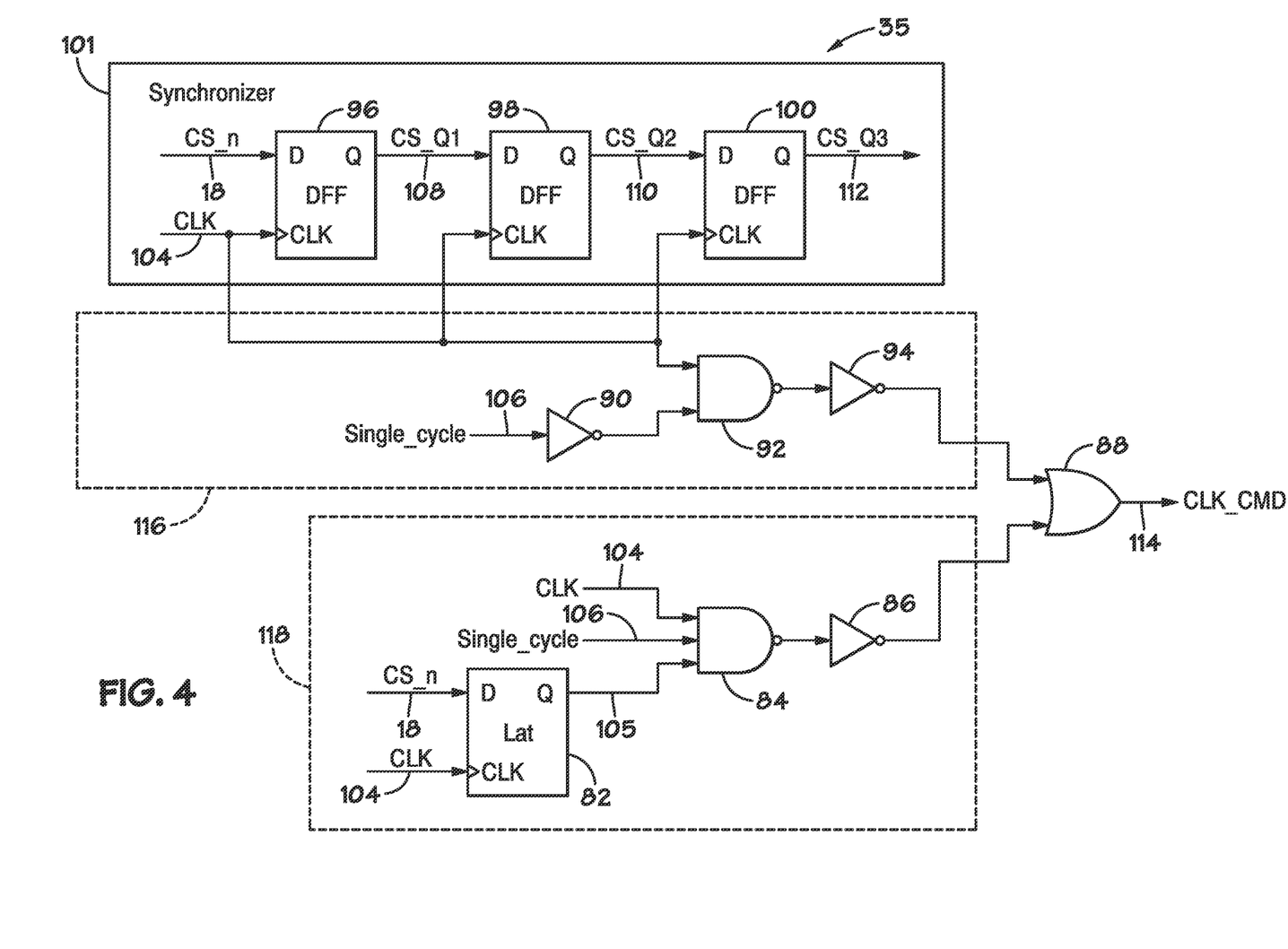
FIG. 4 is a schematic diagram of command clock gating circuitry to gate internal clock signal with the chip select signal, according to an embodiment of the disclosure.

As described above, the clock gating circuitry 35 may utilize the CS_n signal 18 to gate an internal clock signal (CLK) signal that is based on the Clk_t 16 and/or Clk_c 17. With the foregoing in mind, FIG. 4 is a schematic diagram of clock gating circuitry 35 used to gate the internal clock signal (CLK) with the CS_n signal 18. The clock gating circuitry 35 may be implemented in the command decoder 32 and/or outside of the command decoder 32 in another portion of the memory device 10.

The CS_n signal 18 is transmitted into a flip-flop 82. The internal clock signal (e.g., CLK signal) is transmitted as a clock input 104 for the flip-flop 82. It should be noted that the CLK signal 104 is toggling at a rate based upon the specifications of the internal clock of the memory device 10. The flip-flop 82 shifts the CS_n signal 18 by one clock cycle when the CS_n signal 18 and the CLK signal 104 are asserted. An output 105 of the flip-flop 82 is transmitted as an input to a NAND gate 84.

As discussed above, one or more mode registers may indicate when the CS_n signal 18 and/or the CA signal 19 are synchronized with the CLK signal 104. The value of the mode register may be represented as a signal Single_cycle 106. The Single_cycle signal 106 is transmitted into a NAND gate 84. When the Single_cycle signal 106 is asserted, the CS_n signal 18 and/or the CA signal 19 have been trained. The CLK signal 104 is transmitted into a NAND gate 84.

When the Single_cycle signal 106, the CLK signal 104, and the output 105 are each asserted, the NAND gate 84 outputs a de-asserted value to an inverter 86. That is, the NAND gate 84 may output an asserted value to the inverter 86 when any one of the Single_cycle signal 106, the CLK signal 104, and the output 105 are de-asserted. The inverter 86 transmits an inverted output of the NAND gate 84 to an OR gate 88. In other words, the NAND gate 84 and the inverter 86 act as an AND gate that asserts a value to the OR gate 88 when the Single_cycle signal 106, the CLK signal 104, and the latched CS_n signal 18 are all asserted. Otherwise, the output of the inverter 86 is deasserted. Thus, when Single_cycle signal 106 is asserted and the latched CS_n signal 18 is asserted, the output of the inverter 86 to the OR gate is the CLK signal 104. In some embodiments, the NAND gate 84 and the inverter 86 may be replaced with an AND gate.

Furthermore, the Single_cycle signal 106 is additionally transmitted to an inverter 90. The inverter 90 inverts and transmits the Single_cycle signal 106 to a NAND gate 92. The NAND gate 92 transmits a de-asserted value to an inverter 94 when the CLK signal 104 is asserted and the output of the inverter 90 is asserted (when the CS_n signal 18 and/or the CA signal 19 have not been trained). That is, the Single_cycle signal 106 may effectively gate the CLK signal 104 at the NAND gate 92. Otherwise, the NAND gate 92 transmits an asserted value to an inverter 94. The inverter 94 transmits the inverted output of the NAND gate 92 to the OR gate 88. In other words, the NAND gate 92 and the inverter 94 act as an AND gate that asserts a value to the OR gate 88 when the Single_cycle signal 106 is de-asserted and the CLK signal 104 is asserted. Otherwise, the output of the inverter 94 is de-asserted. Thus, when Single_cycle signal 106 is de-asserted the output of the inverter 94 to the OR gate is the CLK signal 104. In some embodiments, the NAND gate 92 and the inverter 94 may be replaced with an AND gate.

A top portion 116 provides the CLK signal 104 to the OR gate 88 when Single_cycle signal 106 is de-asserted, and the bottom portion 118 may transmit the CLK signal 104 to the OR gate 88 when Single_cycle signal 106 is asserted and the latched version of the CS_n signal 18 is asserted. Otherwise, the CLK signal 104 is stopped from propagating to the OR gate 88. The OR gate 88 may transmit a CLK_CMD signal 114. The CLK_CMD signal 114 may represent a gated CLK signal 104 or a free-running CLK signal 104 based upon the value of the CS_n signal 18 and/or the Single_cycle signal 106.

A synchronizer 101 may shift the CS_n signal 18 one or more clock cycles when the CS_n signal 18 is asserted. That is, the CS_n signal 18 is transmitted as a data input to a flip-flop 96. The CLK signal 104 is transmitted as a clock input to the flip-flop 96, a flip-flop 98, and a flip-flop 100. The synchronizer 101 may include flip-flops 96, 98, and 100 to shift the CS_n signal 18 at least three clock cycles. In the illustrated embodiment, the CS_n signal 18 may be de-asserted for at least 3 cycles The flip-flop 96 receives the CS_n signal 18 at its data input and the CLK signal 104 at its clock input. The flip-flop 96 outputs a CS_Q1 signal 108 that is a shifted version of the CS_n signal 18. The flip-flop 98 receives the CS_Q1 signal 108 at its data input and the CLK signal 104 at its clock input. The flip-flop 98 outputs a CS_Q2 signal 110 that is a shifted version of the CS_Q1 signal 108. The flip-flop 100 receives the CS_Q2 signal 110 at its data input and the CLK signal 104 at its clock input. The flip-flop 100 outputs a CS_Q3 signal 112 that is a shifted version of the CS_Q2 signal 110. In other words, the synchronizer 101 shifts the CS_n signal 18 to provide different delayed versions of the CS_n for use in the memory device 10.

Figure 5:
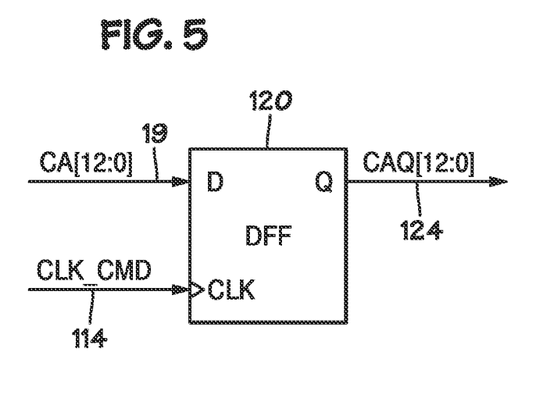
FIG. 5 is a schematic diagram of a flip-flop to gate the command address signal and with the internal clock signal, according to an embodiment of the disclosure.

FIG. 5 is a schematic diagram of a flip-flop 120 to capture the CA signal 19 using the CLK_CMD signal 114. The CLK_CMD signal 114 is transmitted by the clock gating circuitry to latch a respective CA bit in the flip-flop 120. The bits of the CA signal 19 are transmitted the respective data inputs of respective flip-flops 120. It should be understood that the flip-flop 120 may represent one or more flip-flops, where each flip-flop corresponds to one bit of the CA signal 19 bus. As such, each of the flip-flops 120 may hold the bits of the CA signal 19.

A CAQ signal 124 may represent the bits of the CA signal 19 latched into the respective flip flops 120. Thus, the CAQ signal 124 is shifted by one clock cycle from the CA signal 19. The flip-flops 120 transmit the CAQ signal to the command decoder 32. Although the illustrated embodiment shows that the CA signal 19 and the CAQ signal 124 have 13 bits, some embodiments may include fewer or more bits than 13 bits.

Figure 6:
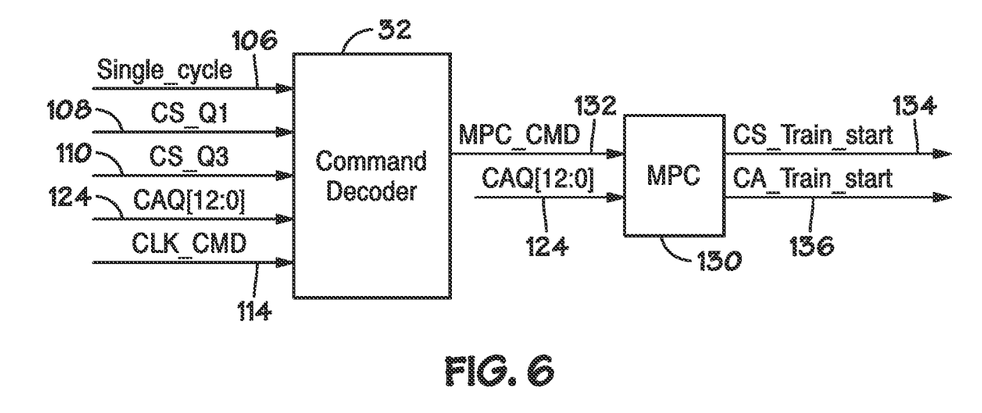
FIG. 6 is a simplified block diagram illustrating the command decoder of FIG. 1 receiving and decoding multi-purpose commands, according to an embodiment of the disclosure.

The command decoder 32 may receive the CAQ signal 124 and decode the valid command from the CAQ signal 124. With the foregoing in mind, FIG. 6 is a simplified block diagram illustrating the command decoder 32 receiving and decoding commands. As described in FIG. 1, the command decoder 32 may receive commands (e.g., MPCs) and decode the commands to perform various operations.

The command decoder 32 may receive the CAQ signal 124 from the flip-flops 120. To decode the CAQ signals 124, the command decoder 32 may use the CS_Q1 signal 108 or the CS_Q3 signal input 110 based upon the value of the Single_cycle signal 106. That is, when the Single_cycle signal 106 is a logical high, the command decoder 32 may use the CS_Q1 signal 108 to decode the incoming command on the CAQ signal 124. When the Single_cycle signal 106 is a logical low, the command decoder 32 may use the CS_Q3 signal 112 to decode the incoming MPC commands in the CAQ signal 124. The command decoder 32 may use the CLK_CMD signal 114 as the internal clock signal for decoding commands.

The command decoder 32 transmits decoded command signals MPC_CMD 132 to MPC circuitry 130. The MPC circuitry 130 also receives the CAQ signal 124 from the flip-flops 120. The MPC circuitry 130 uses the MPC_CMD signal 132 from the command decoder 32 and the CAQ signal 124 to cause one or more commands to be executed. For instance, the MPC circuitry 130 may start the training of the CS_n signal 18 and/or the CA signal 19 using a CS Train Start signal 134 and/or a CA Train Start signal 136 based upon the MPC_CMD signal 132 and the CAQ signal 124.

By employing the techniques described in the present disclosure, the systems described herein may utilize clock gating after indication of the chip select signal (CS_n signal 18) and/or the command address signal (CA signal 19) being synchronized with the internal clock signal (CLK). The clock gating circuitry 35 may gate the CLK signal 104 with the CS_n signal 18 based upon a training indication (e.g., the Single_cycle signal 106) of the training of the CS_n signal 18 and/or the CA signal 19. However, when untrained, the clock gating circuitry 35 allows the CLK signal 104 to run free to ensure capture of a valid command in the CA signal 19 bus.

While only certain features of the present disclosure have been illustrated and described herein, many modifications and changes will occur to those skilled in the art. For example, signal polarity for assertions may be inverted for at least some signals where a logic low is an assertion while a logic high is a de-assertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
    clock gating circuitry configured to receive a clock signal from a host device, wherein the clock gating circuitry comprises:
        a first portion of circuitry configured to gate the clock signal based at least in part on a mode register value indicative of synchronization of a command address signal with the clock signal, wherein gating the clock signal in the first portion comprises allowing the clock signal to run through the first portion when the mode register value indicates the command address signal has not been synchronized with the clock signal; and
        a second portion of circuitry configured to gate the clock signal based at least in part on the mode register value and a chip select signal value.

2. The memory device of claim 1, wherein gating the clock signal in the first portion comprises stopping propagation of the clock signal through the first portion when the mode register value indicates synchronization of the command address signal with the clock signal has occurred.

3. The memory device of claim 1, wherein gating the clock signal in the second portion comprises allowing the clock signal through the second portion when the mode register value indicates synchronization of the command address signal with the clock signal has occurred.

4. The memory device of claim 1, wherein gating the clock signal in the second portion comprises stopping propagation of the clock signal through the second portion when the mode register value indicates the command address signal has not yet been synchronized with the clock signal.

5. The memory device of claim 1, wherein the clock gating circuitry comprises a synchronizer, wherein the synchronizer shifts the chip select signal at least three clock cycles as a first shifted chip select signal.

6. The memory device of claim 5 comprising a command decoder, wherein the command decoder is configured to:
    receive the mode register value;
    when the mode register value indicates synchronization of the command address signal with the clock signal has occurred, use a second shifted chip select signal to decode incoming commands, wherein the second shifted chip select signal is shifted in the synchronizer by fewer clock cycles than the first shifted chip select signal is shifted in the synchronizer; and
    when the mode register value indicates synchronization of the command address signal with the clock signal has not occurred, use the shifted chip select signal to decode incoming commands.

7. The memory device of claim 6, comprising a latch configured to receive the command address signal and to latch the command address signal using the gated clock signal, wherein the command decoder is configured to use the latched command address signal to decode the incoming commands.

8. The memory device of claim 7, wherein the command decoder is configured to decode commands using the latched command address signal and to transmit the decoded commands to MPC circuitry.

9. The memory device of claim 8, wherein the MPC circuitry is configured to:
receive the decoded commands;
receive the latched command address signal; and
execute one or more commands based at least upon the decoded commands and the latched command address signal.

10. The memory device of claim 6, wherein the clock gating circuitry is implemented in the command decoder.

11. The memory device of claim 1, wherein the mode register value is set by the host device.

12. The memory device of claim 1, wherein the memory device is configured to synchronize the chip select signal with the clock signal prior to the synchronization of the command address signal with the clock signal.

13. The memory device of claim 1, wherein the mode register value is indicative of the synchronization of the chip select signal, the command address signal, or both with the clock signal.

14. A method, comprising:
receiving, at clock gating circuitry of a memory device, a clock signal from a host device;
when a mode register value indicates synchronization of a command address signal with the clock signal has not occurred, gating, via the clock gating circuitry, the clock signal based at least in part on the mode register value indicative of synchronization of the command address signal with the clock signal; and
when the mode register value indicates synchronization of the command address signal with the clock signal has occurred, gating, via the clock gating circuitry, the clock signal based at least in part on the mode register value and a chip select signal value, wherein gating the clock signal based at least in part on the mode register value being indicative of no synchronization of the command address signal with the clock signal is performed in a first portion of the clock gating circuitry, and gating the clock signal based at least in part on the chip select signal value and the mode register value indicative of synchronization of the command address signal with the clock signal is performed in a second portion of the clock gating circuitry.

15. The method of claim 14, comprising shifting, via a set of flip-flops, bits of the command address signal by at least one clock cycle.

16. The method of claim 14, comprising:
synchronizing the chip select signal with the clock signal before the mode register value to indicate that synchronization of the command address signal with the clock signal has occurred; and
synchronizing the command address signal with the clock signal before setting the mode register value to indicate that synchronization of the command address signal with the clock signal has occurred.

17. The method of claim 16, wherein synchronizing the chip select signal with the clock signal is performed prior to synchronizing the command address signal with the clock signal.

18. A system, comprising:
a command decoder;
clock gating circuitry configured to receive a clock signal from a host device, wherein the clock gating circuitry is configured to:
propagate the clock signal to the command decoder when a mode register value indicates that synchronization of a command address signal with the clock signal has not occurred;
propagate the clock signal to the command decoder when the mode register value indicates that the synchronization of the command address signal with the clock signal has occurred and a corresponding chip select signal is asserted; and
block propagation of the clock signal to the command decoder when the mode register value indicates that the synchronization of the command address signal with the clock signal has occurred but the corresponding chip select signal is de-asserted.

19. The system of claim 18, wherein the clock gating circuitry comprises a first portion of circuitry configured to propagate the clock signal to the command decoder when the mode register value indicates that synchronization of the command address signal with the clock signal has not occurred and to block propagation of the clock signal to the command decoder via the first portion when the mode register value indicates that synchronization of the command address signal with the clock signal has occurred.

20. The system of claim 19, wherein the clock gating circuitry comprises a second portion of circuitry configured to propagate the clock signal when the mode register value indicates that the synchronization of the command address signal with the clock signal has occurred and the corresponding chip select signal is asserted and to block propagation of the clock signal via the second portion when the corresponding chip select signal is not asserted.

* * * * *